United States Patent [19]

Riordan

[11] Patent Number: 5,263,140
[45] Date of Patent: Nov. 16, 1993

[54] VARIABLE PAGE SIZE PER ENTRY TRANSLATION LOOK-ASIDE BUFFER

[75] Inventor: Thomas J. Riordan, Los Altos, Calif.

[73] Assignee: Silicon Graphics, Inc., Mountain View, Calif.

[21] Appl. No.: 644,705

[22] Filed: Jan. 23, 1991

[51] Int. Cl.$^5$ ............................................. G06F 12/00
[52] U.S. Cl. ..................... 395/400; 364/DIG. 1; 364/256.3; 364/256.4; 364/238.6
[58] Field of Search ................... 395/400, 425; 365/49

[56] References Cited

U.S. PATENT DOCUMENTS

| | | | |
|---|---|---|---|
| 3,675,215 | 7/1972 | Arnold | 340/172.5 |
| 4,356,549 | 10/1982 | Church | 395/400 |
| 4,654,777 | 3/1987 | Nakamura | |
| 4,758,946 | 7/1988 | Shar et al. | |
| 4,763,250 | 8/1988 | Keshlear et al. | |
| 4,812,969 | 3/1989 | Takagi et al. | 364/200 |
| 4,972,338 | 11/1990 | Crawford et al. | |
| 5,058,003 | 10/1991 | White | 395/400 |
| 5,133,058 | 7/1992 | Jensen | 395/400 |

FOREIGN PATENT DOCUMENTS 0242854 10/1987 European Pat. Off. .
0463978 1/1992 European Pat. Off. .

OTHER PUBLICATIONS

Holden et al., "Integrated Memory Management for the MC68030," 1987 IEEE Int'l. Conf. on Computer Design: VLSI in Computers & Processors, IEEE Computer Soc. Press; U.S., pp. 586–589.

Primary Examiner—Rebecca L. Rudolph
Attorney, Agent, or Firm—Townsend and Townsend Khourie and Crew

[57] ABSTRACT

A translation look-aside buffer with a variable page size per entry is disclosed. Each entry can have a different number of bits translated from a virtual address to a physical address. Each entry in the TLB contains an indication of the page size for that entry. When the translation is done, the indication of page size determines how many bits are translated.

18 Claims, 2 Drawing Sheets

VARIABLE PAGE SIZE PER ENTRY TRANSLATION LOOK-ASIDE BUFFER

BACKGROUND

The present invention relates to Translation Look-Aside Buffers (TLB).

Many modern data processing units rely on a virtual to physical address mapping for establishing and managing the distinction between a user's view of memory and the actual physical manifestation of that memory.

For a variety of reasons, it is desirable that the page size be different for specific uses of the processor or even within a single use for different regions within the memory space. The page size is the portion of an address which remains unmapped in the translation from virtual to physical address through the TLB. An incomplete but representative list of these reasons is as follows:

(1) The "best" page size can be a function of the specific operating system which is being used. This might be particularly true when considering different types of operating systems such as general purpose, real time, embedded control, etc. It might also be true, however, for different general purpose operating systems.

(2) Even within one operating system, it is often desirable to have different page sizes for different regions of memory. In particular, while a typical user process desires a small to medium page size, say four to sixteen kilobytes, a process which is responsible for updating a bit-mapped display terminal desires a very large page size, generally greater than one megabyte.

(3) In a similar vein, a less typical but very important application such as a scientific program with a very large data space desires a medium to large page size in order to "reach" all of its data without excessive overhead due to "misses" in the TLB. The desired page size in this case could be in the sixty-four kilobyte to one megabyte range.

(4) As a final example, the operating system itself needs to be able to access all of the memory space and for performance reasons it is necessary that it not use a large number of TLB entries for this purpose since they are then not available to the user processes. The operating system therefore desires to map all of memory using only a few very large pages.

Two other parameters of interest when specifying a TLB are the degree of associativity and the number of entries.

The degree of associativity can range from no associativity, typically referred to as direct mapped, to fully associative. Typical implementations use no less than degree four associativity, called four way set associative, and many implementations are fully associative. The higher the degree of associativity the less chance there is for mapping collisions: i.e., two or more physical addresses which cannot be co-resident in the TLB because they have the same value for the portion of the address which is used to index into the TLB. In a two way set TLB it is possible to have two entries with the same index, four way can have four, and so on up to fully associative where there is no index and any entry can map any address. All other things being equal, fully associative is the most desirable.

The number of entries is simply the number of different virtual to physical mappings that the TLB can maintain at any one time. This number is determined almost purely by the physical size of the TLB measured in number of components or printed circuit board area or silicon area, etc.

In processors implemented in full custom VLSI, it is quite feasible to build a fully associative TLB. This is true primarily due to the degree of regularity which can be achieved in a fully associative implementation. There are essentially only two distinct parts to the TLB. The content addressable memory, or CAM portion and the physical storage portion. This contrasts with a set associative implementation which has five parts: an index decoder, a virtual storage portion, a comparator portion, a selection portion, and a physical storage portion. In essence, the fully associative implementation combines the first four pieces of the set associative implementation into a single CAM array.

SUMMARY OF THE INVENTION

The present invention provides a translation look-aside buffer with a variable page size per entry. Each entry can have a different number of bits translated from a virtual address to a physical address. Each entry in the TLB contains an indication of the page size for that entry. When the translation is done, the indication of page size determines how many bits are translated.

Preferably, the TLB uses a physical memory array which is accessed by match line outputs from a content addressable memory (CAM). A portion of the memory locations for each entry in the CAM stores two bits of information, rather than one. This allows four different states to be stored. In the normal CAM entry, one bit is stored in each position, giving two states. These two states will allow that bit to match either a one or a zero on the virtual address input bit. With four states, in addition to matching a one or a zero, an "always match" value can be stored. The "always match" values are written into the positions of the entry in the CAM within the selected page size. Thus, these positions can be used to provide a match for the virtual address where the position is outside the page size, and can be disregarded when they are within the page size.

After a match provides an output for the memory array, a logic circuit substitutes the original virtual address for portions of the memory array output according to the page size stored in the CAM. The page size is originally written into the CAM entry using a mask register which is programmed with the desired page size (the mask register is used to mask out portions of an entry upon it being written to, causing an "always match" value to be written in).

For a fuller understanding of the nature and advantages of the invention, reference should be made to the ensuing detailed description taken in conjunction with the accompanying drawings

DETAILED DESCRIPTION OF THE PREFERRED EMBODIMENTS

Figure 1:
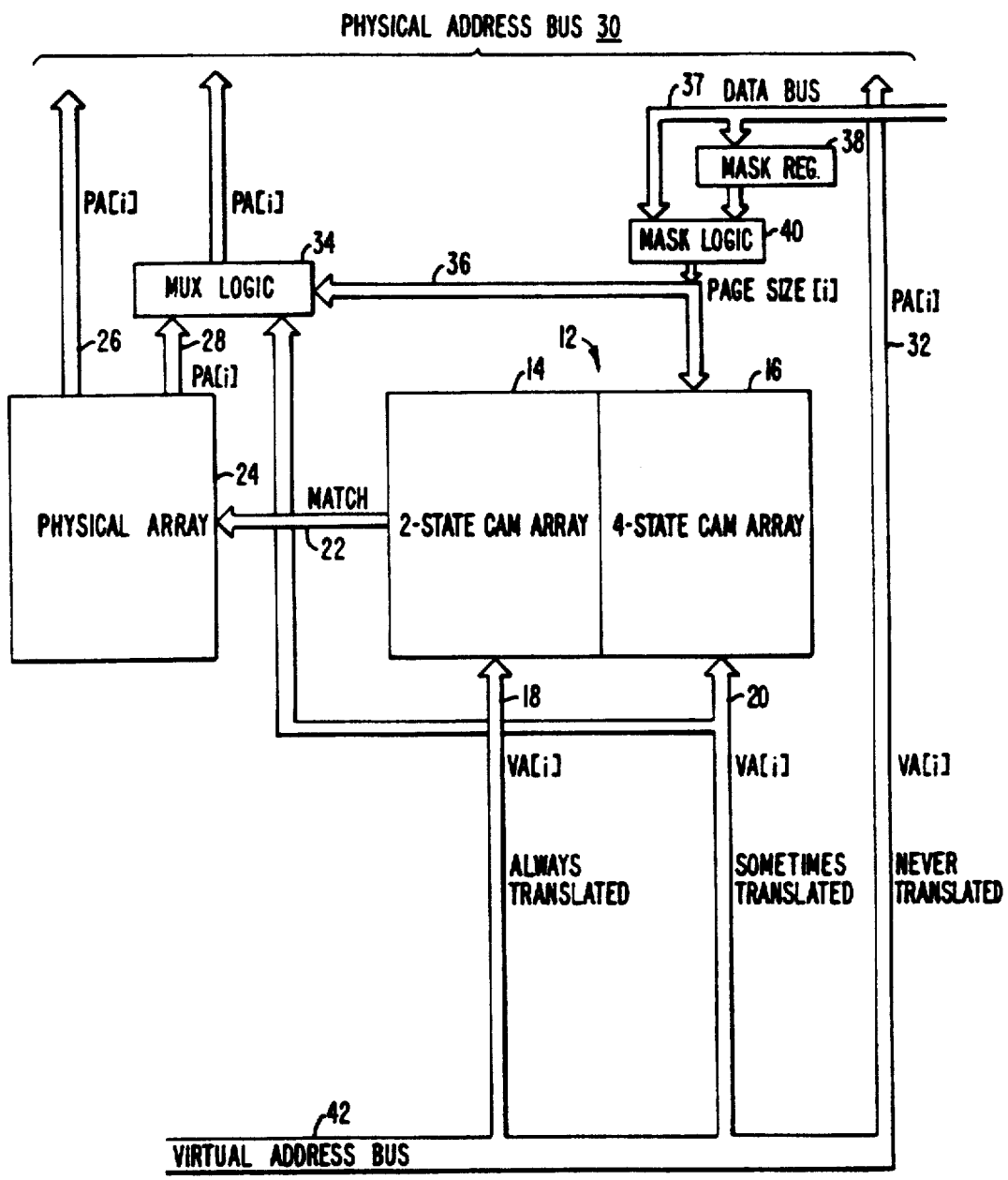
FIG. 1 is a diagram of an embodiment of a variable page size per entry TLB according to the present invention.

FIG. 1 is a diagram of one embodiment of a variable page size per entry TLB according to the present invention. A content addressable memory (CAM) 12 has a two-state array portion 14 and a four-state array 16. A CAM cell stores a single bit of information so that each cell can be programmed to match on either a logic one or a logic zero. By adjusting the CAM cell to store two bits of information it is possible to introduce a third matching possibility that being match on either one or zero which can also be called "always match". A fourth capability exists which is to never match. This capability could be used to disable entries for testing or performance analysis.

The CAM portion of the TLB is divided into two sections. The "lower" section 16 is populated with the two-bit or four-state CAM cells while the "upper" section 14 is populated with the normal single-bit or two-state CAM cells. The dividing point between the two sections determines the range of variability of the page size. In one embodiment this range is from four kilobytes to sixteen megabytes but it should be noted that this is purely a matter of implementation.

In order to achieve a correct translation through the TLB it is necessary to determine what size page was programmed into the TLB entry which "matched". A matching entry is one where the incoming address has the same binary pattern as that held in the TLB entry. In order to determine the page size it is necessary to "read" the bit pattern contained in the CAM array at the same time that the bit pattern representing the translation is being read out of the physical storage array. After reading the CAM portion, it is noted which locations were programmed to be always match and the corresponding locations in the translated address must "pass through" the incoming virtual address and discard the associated translation. Another way of looking at this is that as the page size gets larger the number of untranslated bits also gets correspondingly larger with the only difficulty being that as the page size is variable on a per entry basis, it is necessary to dynamically determine that page size.

Virtual addresses are provided on buses 18 and 20 to arrays 14 and 16, respectively. If the address on buses 18 and 20 matches the stored address in the CAM array, one of match lines 22 will be activated. Match lines 22 are coupled to different entries in a physical array 24. The entry for which the match line is activated will produce its output on physical address buses 26 and 28. For a normal TLB operation, both addresses 26 and 28 will be provided as part of a physical address bus 30. The translated portion on bus 26 and 28 is the page, while the untranslated portion on a bus 32 gives a location within that page.

Two state CAM array 14 provides a single bit for each position, indicating whether it should provide a match for a zero or a one of that bit position of the input virtual address. 4-state CAM array 16 either matches on a zero or a one, or can always produce a match, depending upon how it is programmed. The portion which is programmed to always produce a match is a portion which should be associated with the never-translated bits of bus 32 which provide the location within the page, rather than the page location. Thus, these bits will be provided from bus 20 through multiplexing logic 34 rather than the corresponding bits on bus 28 from physical array 24. The positions for which the bits from bus 20 are to be substituted for those from bus 28 are determined by reading the states in the CAM array 16 and providing an indication of the page size on data I/O lines 36 to multiplexing logic 34. Multiplexing logic 34 then selects the inputs from bus 20 for positions in an entry which were programmed to be "always match".

The programming of 4-state CAM array 16 is done using a mask register 38 and mask logic 40. Mask register 38 will indicate the page size currently being used. The currently running program can enter the page size into register 38 from data bus 37. Mask logic 40 will then substitute bits which will indicate an "always match" for the lines of data bus 37 corresponding to bits within the page size as indicated by mask register 38.

Figure 2:
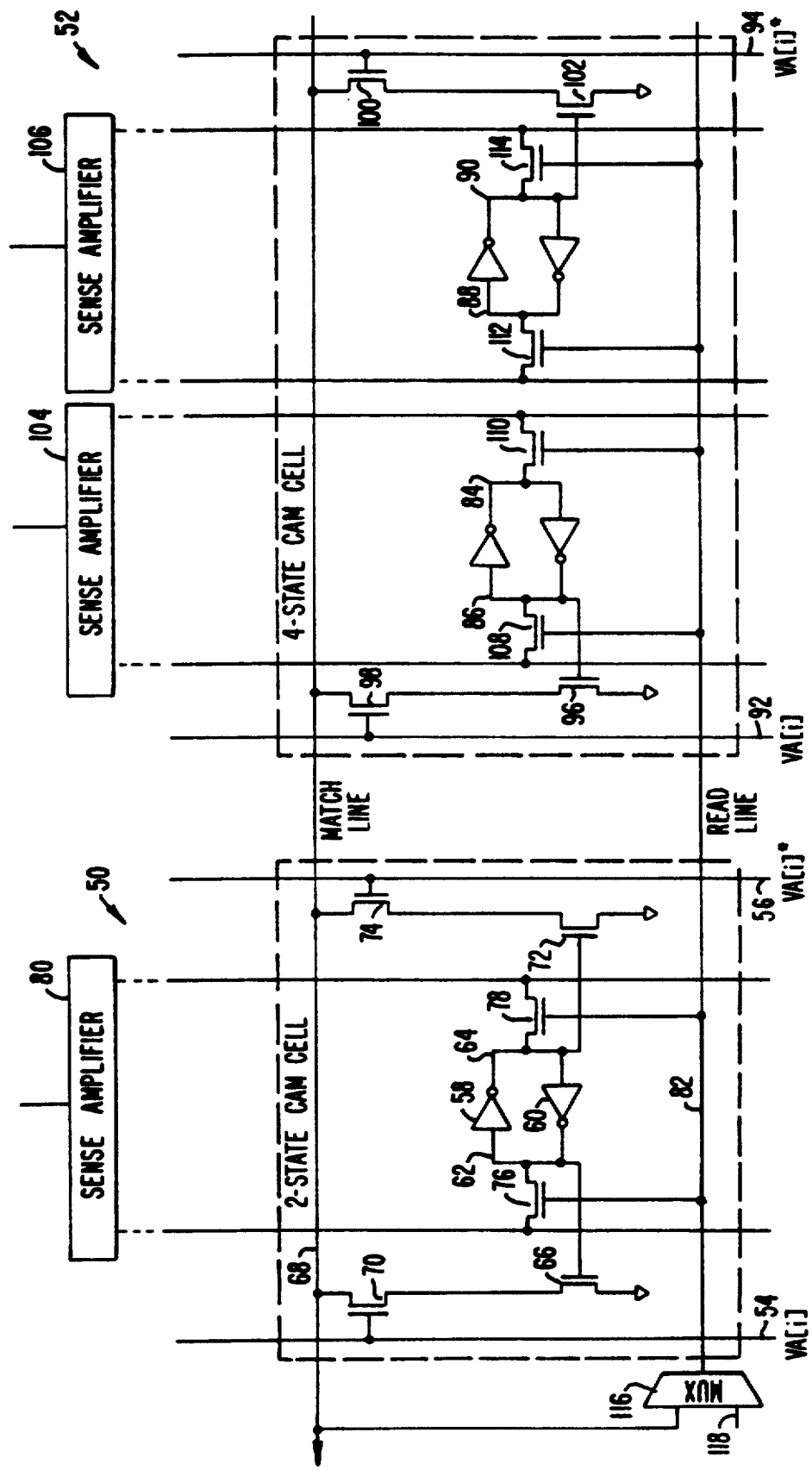
FIG. 2 is a diagram of two-state and four-state positions in an entry in the CAM array of FIG. 1.

FIG. 2 shows a two-state CAM cell 50 from CAM array 14 of FIG. 1 and a four-state CAM cell 52 from CAM array 16. CAM cell 50 has a virtual address input bit line 54, with the inverse of that bit being provided on line 56. The storage portion of the cell is illustrated as a pair of inverters 58 and 60 coupling together nodes 62 and 64. Node 62 is connected to the gate of a transistor 66. Transistor 66 is coupled to match line 68 via a transistor 70. If transistor 66 and 70 are turned on, match line 68 will be pulled low. Since match line 68 has a number of cells positioned along it corresponding to the different bits of the virtual address, any cell which pulls it low will indicate that there is not a match.

If it is desired to match with a digital 1, a one will be stored at node 64, giving its inverse, a zero at node 62. This will turn off transistor 66 so that when the one value appears on line 54 and transistor 70 is activated, match line 68 will not be brought down. At the same time, the one value on node 64 activates a transistor 72. Transistor 72 will pull match line 60 low through transistor 74 if the input value on line 54 is a zero, giving a one value in its inverse input line 56, to activate transistor 74. Thus, if a one is stored in cell 50, it will pull match line 68 low if a zero is presented as a virtual address bit, but will not pull it low if a one is presented as a virtual address bit.

By programming a zero on node 64, a similar result can be obtained when a zero bit is presented for a match. In this case, a zero is on node 64, giving its inverse, a one, on a node 62, activating transistor 66. As can be seen, both the value and its inverse must be stored and both the value and its inverse must be presented on the virtual address inputs in order to match for either a zero or a one.

The state programmed on the cell can be read through transistors 76 and 78 by sense amplifier 80. Transistors 76 and 78 are activated by a read line 82.

In contrast, 4-state CAM cell 52 provides for the storage of two bits of information, with a first bit and its inverse being stored on nodes 86 and 84, and the second bit and its inverse being stored on nodes 90 and 88. However, similar to cell 50, only the virtual address input bit on a line 92 and its inverse on a line 94 are required. To cause the cells to match on a one value on bit line 92, a one must be stored at node 84 and a zero at node 88. The one at node 84 will cause its inverse, a zero, to be at node 86, thereby deactivating transistor 96 and preventing transistor 98 from pulling match line 68 low when there is a one on line 92. The one on line 92 causes a zero to be on line 94, which will not activate transistor 100. However, if a non-match value of zero appears on line 92, providing a one on 94, transistor 100 will be activated, pulling match line 68 low since transistor 102 is activated by the one on node 90 which is the inverse of the zero on node 88.

Similarly, it can be seen that storing the value of zero on node 84 and one on node 88 will cause a match for an input zero. To achieve an always match condition, a zero is written at both node 86 and at node 90, causing their inverses at nodes 84 and 88 to be ones. Both transistors 96 and 102 will thus always be off, so that no matter what values are applied on line 92 and its inverse on line 94, match line 68 will remain high, indicating a match. A final value of "never match" can be provided by programming ones on nodes 86 and 90.

A pair of sense amplifiers 104 and 106 are used to read the two bits stored through transistors 108, 110, 112 and 114 which have their gates coupled to read line 82.

The circuitry for programming the cells of the present invention is standard and has not been shown in order to avoid obscuring the clarity of the circuit for the present invention. After a match has been produced on line 68, bus 36 of FIG. 1 must indicate which bit positions have been programmed to be "always match" so that multiplexing logic 34 of FIG. 1 can determine which bits to use from array 24. This reading is accomplished by feeding back match line 68 through a multiplexer 116 to read line 82. The outputs of sense amplifiers 104 and 106 for each position can then be read to determine if a 00 was programmed. Multiplexer 116 has a separate input 118 used for normal reading of the circuit.

As will be understood by those familiar with the art, the present invention may be embodied in other specific forms without departing from the spirit or essential characteristics thereof. For example, a normal 2-state CAM array could be used, with additional bits tacked on to the end solely for the purpose of indicating the page size. These additional bits could even form a separate memory which would be addressed by the same match line which addresses the physical array. Accordingly, the disclosure of the preferred embodiment of the invention is intended to be illustrative, but not limiting, of the scope of the invention which is set forth in the following claims.

What is claimed is:

1. A translation look-aside buffer (TLB) comprising:
   a plurality of memory locations, each storing a single physical address;
   tag means for storing a plurality of virtual tags corresponding to said physical addresses;
   page means, associated with each of said memory locations, for storing an indication of a page size which can differ for each memory location; and
   control means, responsive to said page means, said tag means and an input virtual address, for providing a variable number of bits of said physical address as an output address, the remaining bits of said output address being bits of said input virtual address.

2. The TLB of claim 1 wherein said tag means and page means comprises a content addressable memory (CAM) having inputs coupled to a virtual address bus and having match outputs, coupled to a memory array of said memory locations, for indicating a match between said virtual tags and said input virtual address.

3. The TLB of claim 2 wherein said control means comprises a multiplexer having first inputs coupled to said memory array, second inputs coupled to a portion of said virtual address bus and select inputs coupled to said CAM.

4. The TLB of claim 2 wherein said CAM comprises a plurality of cells, each cell containing a bit of said virtual tags, at least a portion of said cells having an extra bit for indicating whether the virtual tag bit of the cell is within a page.

5. The TLB of claim 4 wherein a portion of said cells have only one bit stored.

6. The TLB of claim 4 further comprising:
   a mask register for storing a value indicating a page size;
   logic means, having inputs coupled to a data bus and said mask register, and outputs coupled to data I/O lines of said CAM, for writing an always match value to cells in an entry corresponding to the value in said mask register.

7. The TLB of claim 2 further comprising means for coupling each of said match outputs back to a read control input for each of said entries in said CAM.

8. The TLB of claim 7 wherein said means for coupling comprises a plurality of multiplexers, each multiplexer having an output coupled to a read control line for an entry, a first input coupled to a match output for said entry and a second input coupled to a read control input for said entry.

9. A translation look-aside buffer (TLB) comprising:
   a physical array with a plurality of memory locations for storing physical addresses;
   a content addressable memory (CAM), for storing a plurality of virtual tags corresponding to said physical addresses, having inputs coupled to a virtual address bus and having match outputs, coupled to said physical array, for indicating a match between said virtual tags and an input virtual address, wherein said CAM comprises a plurality of cells, each cell containing a bit of said virtual tags, at least a portion of said cells having an extra bit for indicating whether the virtual tag bit of the cell is within a page; and
   means, responsive to said extra bits in said CAM for providing a variable number of bits of said physical address as an output address, the remaining bits of said output address being bits of said virtual address bus.

10. The TLB of claim 9 wherein said means for providing a variable number of bits comprises a multiplexer having first inputs coupled to said physical array, second inputs coupled to a portion of said virtual address bus and select inputs coupled to said CAM.

11. The TLB of claim 9 wherein said positions in said CAM having two bits each comprise:
   a first memory cell for storing a first bit value and its inverse;
   a second memory cell for storing a second bit value and its inverse;
   a virtual address bit line;
   an inverse virtual address bit line;
   first means for providing a signal to one of said match outputs responsive to signals on said first memory cell and said virtual address bit line; and
   second means for providing a signal to said one of said match outputs responsive to signals on said second memory cell and said inverse virtual address bit line.

12. The TLB of claim 11 wherein said first means for providing comprises:
   a first transistor having a first control lead coupled to said virtual address bit line, a second lead coupled to a match output and a third lead; and
   a second transistor having a first control lead coupled to said first memory cell, a second lead coupled to said third lead of said first transistor, and a third lead coupled to ground.

13. The TLB of claim 11 further comprising a first sense amplifier coupled to said first memory cell and a second sense amplifier coupled to said second memory cell.

14. The TLB of claim 9 further comprising:
a mask register for storing a value indicating a page size;
logic means, having inputs coupled to a data bus and said mask register, and outputs coupled to data I/O lines of said CAM for said entries having two bits, for writing an always match value to cells in an entry corresponding to the value in said mask register.

15. The TLB of claim 9 further comprising means for coupling each of said match outputs back to a read control input for each of said entries in said CAM.

16. The TLB of claim 15 wherein said means for coupling comprises a plurality of multiplexers, each multiplexer having an output coupled to a read control line for an entry, a first input coupled to a match output for said entry and a second input coupled to a read control input for said entry.

17. A translation look-aside buffer (TLB) comprising:
a physical array with a plurality of memory locations for storing physical addresses;
a content addressable memory (CAM), for storing a plurality of virtual tags corresponding to said physical addresses, having inputs coupled to a virtual address bus and having match outputs coupled to said physical array, for indicating a match between said virtual tags and an input virtual address, wherein said CAM comprises a plurality of cells, each cell containing a bit of said virtual tags, at least a portion of said cells having an extra bit for indicating whether the virtual tag bit of the cell is within a page;
means, responsive to said extra bits in said CAM for providing a variable number of bits of said physical address as an output address, the remaining bits of said output address being bits of said virtual address bus;
a mask register for storing a value indicating a page size; and
logic means, having inputs coupled to a data bus and said mask register, and outputs coupled to data I/O lines of said CAM for said entries having two bits, for writing an always match value to cells in an entry corresponding to the value in said mask register.

18. A translation look-aside buffer (TLB) comprising:
a physical array with a plurality of memory locations for storing physical addresses;
a content addressable memory (CAM), for storing a plurality of virtual tags corresponding to said physical addresses, having inputs coupled to a virtual address bus and having match outputs coupled to said physical array, for indicating a match between said virtual tags and an input virtual address, wherein said CAM comprises a plurality of cells, each cell containing a bit of said virtual tags, at least a portion of said cells having an extra bit for indicating whether the virtual tag bit of the cell is within a page; and
a multiplexer having first inputs coupled to said physical array, second inputs coupled to said a portion of said virtual address bus and select inputs coupled to said CAM.

* * * * *